(12) United States Patent
Liu (10) Patent No.: US 10,249,653 B2
(45) Date of Patent: Apr. 2, 2019

(54) DISPLAY PANEL AND MANUFACTURING METHOD THEREOF

(71) Applicant: Shenzhen China Star Optoelectronics Semiconductor Display Technology Co., Ltd., Shenzhen (CN)

(72) Inventor: Minggang Liu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/577,204

(22) PCT Filed: Nov. 22, 2017

(86) PCT No.: PCT/CN2017/112397
§ 371 (c)(1),
(2) Date: Nov. 27, 2017

(65) Prior Publication Data
US 2019/0027514 A1    Jan. 24, 2019

(30) Foreign Application Priority Data
Jul. 19, 2017  (CN) .......................... 2017 1 0592928

(51) Int. Cl.
| H01L 27/00 | (2006.01) |
| H01L 27/12 | (2006.01) |
| G02F 1/1335 | (2006.01) |
| G02F 1/1362 | (2006.01) |

(Continued)

(52) U.S. Cl.
CPC ........ *H01L 27/1288* (2013.01); *G02F 1/1368* (2013.01); *G02F 1/13394* (2013.01); *G02F 1/133516* (2013.01); *G02F 1/136209* (2013.01); *G02F 1/136286* (2013.01); *H01L 27/124* (2013.01); *H01L 27/1248* (2013.01); *H01L 27/1262* (2013.01); *G02F 2001/13396* (2013.01); *G02F 2001/136222* (2013.01); *G02F 2001/136295* (2013.01)

(58) Field of Classification Search
CPC .................................................. H01L 27/1288
See application file for complete search history.

(56) References Cited

U.S. PATENT DOCUMENTS 7,952,659 B2 *  5/2011  Takahashi  ......... G02F 1/133516
                                              349/106
8,040,471 B2 * 10/2011  Kim ..................... G02F 1/13394
                                              349/106

(Continued)

*Primary Examiner* — William Harriston
(74) *Attorney, Agent, or Firm* — Muncy, Geissler, Olds & Lowe, P.C.

(57) ABSTRACT

A display panel and a manufacturing method thereof are provided. The display panel includes a color resist layer, a protective layer and a light-shielding layer. The color resist layer is formed with a first channel having a first color resist block and a second color resist block therein. The light-shielding layer has a base, a first protrusion corresponding to the first color resist block, and a second protrusion corresponding to the second color resist block. The first protrusion is configured as a main photo spacer. The second protrusion is configured as a sub photo spacer. The protective layer is formed with a second channel corresponding to the second color resist block. The sub photo spacer is directly connected to the second color resist block.

20 Claims, 7 Drawing Sheets

(51) Int. Cl.
*G02F 1/1368* (2006.01)
*G02F 1/1339* (2006.01)

(56) References Cited

U.S. PATENT DOCUMENTS

| | | | |
|---|---|---|---|
| 8,269,924 B2 * | 9/2012 | Takahashi | G02F 1/133514 349/106 |
| 9,684,213 B2 * | 6/2017 | Wu | G02F 1/13394 |
| 2005/0253984 A1 * | 11/2005 | Kim | G02F 1/1362 349/106 |
| 2007/0002218 A1 * | 1/2007 | Park | G02F 1/133514 349/106 |
| 2007/0216832 A1 * | 9/2007 | Takahashi | G02F 1/133516 349/106 |

* cited by examiner

DISPLAY PANEL AND MANUFACTURING METHOD THEREOF

CROSS REFERENCE TO RELATED APPLICATIONS

This application is a U.S. National Phase application submitted under 35 U.S.C. § 371 of Patent Cooperation Treaty Application serial No. PCT/CN2017/112397, filed on Nov. 22, 2017, which claims the priority of China Patent Application serial No. 201710592928.7, filed on Jul. 19, 2017, the disclosures of which are incorporated herein by reference in their entirety.

FIELD OF THE INVENTION

The present invention relates to the field of displaying, and more particularly to a display panel and manufacturing method thereof.

BACKGROUND OF THE INVENTION

Existing display panels mainly include liquid crystal displays (LCDs) and organic light emitting diode (OLED) displays, where OLED display panels possess many outstanding properties such as self-luminous, low driving voltage, high electroluminescent efficiency, short response time, high resolution and contrast, near 180 degree of view angle, wide range of working temperatures, amenability to flexible displays, large scale full-color display, etc. The OLEDs are considered to be display panels having greatest potential for development.

Figure 1:
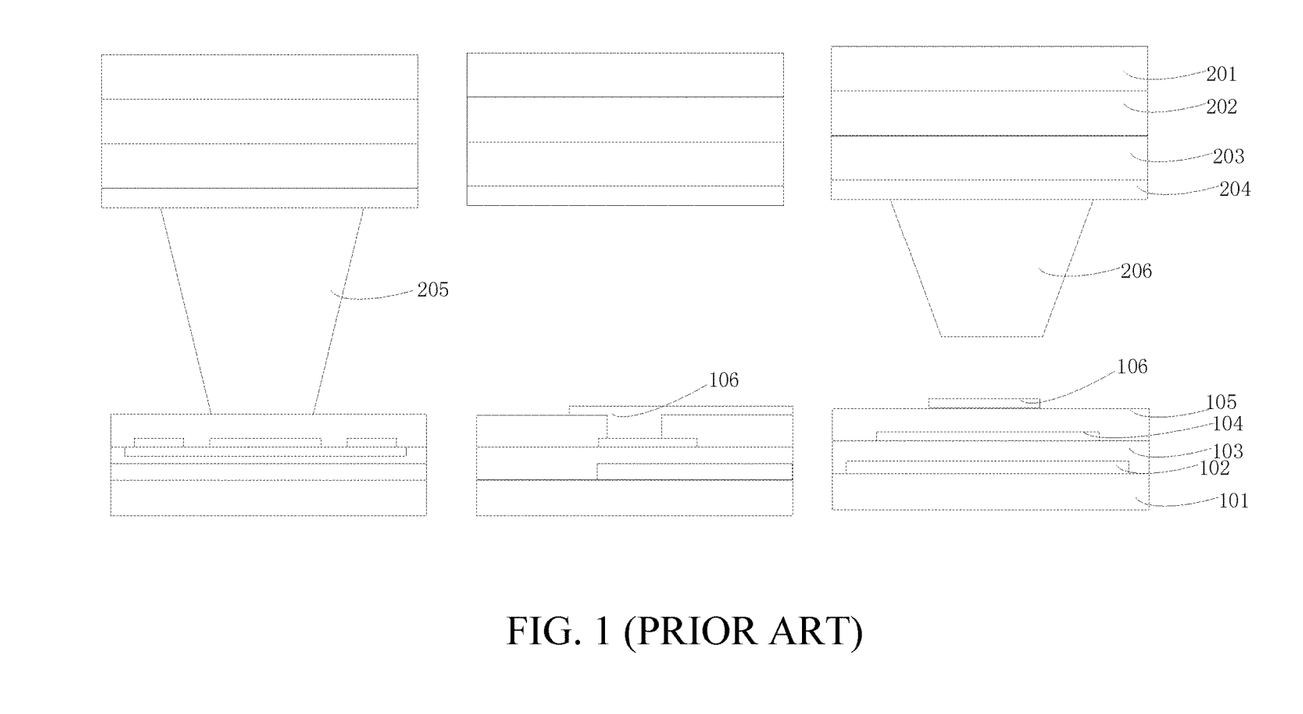
FIG. 1 is a schematic view of a structure of a conventional display panel.

In conventional art, as shown in FIG. 1, a conventional display panel comprises an array substrate disposed with a color filter substrate, the array substrate includes a first substrate layer 101, a first metal layer 102, a first insulating layer 103, a second metal layer 104, a protective layer 105 and a public electrode 106 arranged in sequence. The color filter substrate includes a second substrate layer 201, a black matrix 202, a color resist layer 203 and a public electrode layer 204 arranged in sequence. The substrate assay and the color filter substrate are secured by a frame and formed a sealed space. The sealed space is filled with a liquid crystal material and a photo spacer. The photo spacer includes a main photo spacer and a sub photo spacer. The main photo spacer and the second photo spacer positioned on one side of the color filer substrate, wherein the photo spacer (PS) and the black matrix (BM) are made of different materials and made using different manufacturing processes, wherein the photo spacer (PS) is a transparent material. Using a technique of photomask of gray tone mask (GTM) or half tone mask (HTM), produces a main photo spacer (Main PS) and a sub photo spacer (Sub PS) with different heights.

A black photo spacer (BPS) is a black flexible material. The black photo spacer not only shields light as a BM, but also supports the display area as a PS. Present BPS material makes the combination of manufacturing black matrix BM and PS possible. This technique saves one manufacturing process in manufacturing liquid crystal panels, and saves money, including costs produced by mask costs, manufacturing processes, instrument platforms, etc. Owing to the photomask technique of the multi-tone mask (MTM), the BPS is able to be exposed under three different exposure intensities, and achieve a BPS pattern with three different thicknesses of a BM, a Main PS, and a sub PS after patterning. The technique of MTM is sophisticated and expensive. Also, since achieving three heights, the manufacturing process of BPS is complicated.

SUMMARY OF THE INVENTION

A main object of the present invention is to provide a display panel and a manufacturing method thereof to solve the problems in the existing technique of Multi Tone Mask that is sophisticated and expensive.

To achieve the above object, the present invention utilizes the following technical solutions:

A display panel, comprising:
a substrate layer;
a first metal layer formed on the substrate layer, wherein the first metal layer comprises a gate line;
a first insulating layer formed on the first metal layer;
a second metal layer formed on the first insulating layer, wherein the second metal layer and the gate line form a thin film transistor;
a color resist layer formed on the second metal layer, wherein a channel is formed on the color resist layer corresponding to the gate line, the channel having a first color resist block and a second color resist block therein, and the first color resist block and the second color resist block are spaced apart from each other;
a protective layer formed on the color resist layer and configured to protect the color resist layer; and
a light-shielding layer formed on the protective layer and aligned with the channel, wherein the light-shielding layer comprises a base, a first protrusion corresponding to the first color resist block, and a second protrusion corresponding to the second color resist block, the first protrusion is configured as a main photo spacer, the second protrusion is configured as a sub photo spacer, and a height difference between the main photo spacer and the sub photo spacer relative to the base is formed;

wherein a channel is formed on the protective layer corresponding to the second color resist block, the sub photo spacer is directly connected to the second color resist block, such that the height difference between the main photo spacer and the sub photo spacer is formed;

wherein the first color resist block and the second color resist block are connected to two sides of the channel, respectively, a width of the first color resist block is greater than a width of the second color resist block, such that a thickness of the light-shielding layer disposed on the first color resist layer is greater than a thickness of the light-shielding layer disposed on the second color resist layer, to increase the height difference between the main photo spacer and the sub photo spacer; and wherein each of the first color resist block and the second color resist block comprises at least one layer of color resist.

In the display panel of the present invention, wherein each of the first color resist block and the second color resist block comprises two layers of color resists having different colors.

In the display panel of one preferred embodiment of the present invention, wherein each of the first color resist block and the second color resist block comprises one layer of color resist.

In the display panel of the present invention, wherein each of the first color resist block and the second color resist block comprise layers of color resists.

In the display panel of the present invention, wherein the first color resist block comprises layers of color resists, and the second color resist block comprises one layer of color resist, to increase the height difference between the main photo spacer and the sub photo spacer.

In the display panel of the present invention, wherein the first color resist block and the second color resist block are connected to two sides of the channel, respectively, a width of the first color resist block is greater than a width of the second color resist block, such that a thickness of the light-shielding layer disposed on the first color resist layer is greater than a thickness of the light-shielding layer disposed on the second color resist layer, to increase the height difference between the main photo spacer and the sub photo spacer.

To achieve the above object, the present invention provides a display panel further utilizes the following technical solutions:

A display panel, comprising,
a substrate layer;
a first metal layer formed on the substrate layer, wherein the first metal layer comprises a gate line;
a first insulating layer formed on the first metal layer;
a second metal layer formed on the first insulating layer, wherein the second metal layer and the gate line form a thin film transistor;
a color resist layer formed on the second metal layer, wherein a channel is formed on the color resist layer corresponding to the gate line, the channel having a first color resist block and a second color resist block therein, and the first color resist block and the second color resist block are spaced apart from each other;
a protective layer formed on the color resist layer and configured to protect the color resist layer; and
a light-shielding layer formed on the protective layer and aligned with the channel, wherein the light-shielding layer comprises a base, a first protrusion corresponding to the first color resist block, and a second protrusion corresponding to the second color resist block, the first protrusion is configured as a main photo spacer, the second protrusion is configured as a sub photo spacer, and a height difference between the main photo spacer and the sub photo spacer relative to the base is formed; and
wherein a channel is formed on the protective layer corresponding to the second color resist block, the sub photo spacer is directly connected to the second color resist block, such that the height difference between the main photo spacer and the sub photo spacer is formed.

In the display panel of the present invention, wherein each of the first color resist block and the second color resist block comprises two layers of color resists.

In the display panel of the present invention, wherein each of the first color resist block and the second color resist block comprises two layers of color resists having different colors.

In the display panel of the present invention, wherein each of the first color resist block and the second color resist block comprises one layer of color resist.

In the display panel of the present invention, wherein each of the first color resist block and the second color resist block comprise layers of color resists.

In the display panel of the present invention, wherein the first color resist block comprises layers of color resists, and the second color resist block comprises one layer of color resist, to increase the height difference between the main photo spacer and the sub photo spacer.

In the display panel of the present invention, wherein the first color resist block and the second color resist block are connected to two sides of the channel, respectively, a width of the first color resist block is greater than a width of the second color resist block, such that a thickness of the light-shielding layer disposed on the first color resist layer is greater than a thickness of the light-shielding layer disposed on the second color resist layer, to increase the height difference between the main photo spacer and the sub photo spacer.

Furthermore, the present invention provides a manufacturing method of a display panel, the technical solution is as follows:

A method for manufacturing a display panel, comprising steps of:
providing a substrate layer;
forming a first metal layer on the substrate layer, wherein the first metal layer comprises a gate line;
forming a first insulating layer on the first metal layer;
forming a second metal layer on the second insulating layer, wherein the second metal layer and the gate line form a thin film transistor;
forming a color resist layer on the second metal layer, wherein a channel is formed on the color resist layer corresponding to the gate line, the channel having a first color resist block and a second color resist block therein, and the first color resist block and the second color resist block are spaced apart from each other;
forming a protective layer on the color resist layer, wherein the protective layer is configured to protect the color resist layer;
forming a light-shielding layer on the protective layer, wherein the light-shielding layer aligned with the channel, the light-shielding layer comprises a base, a first protrusion corresponding to the first color resist block, and a second protrusion corresponding to the second color resist block, the first protrusion is configured as a main photo spacer, the second protrusion is configured as a sub photo spacer, such that a height difference between the main photo spacer and the sub photo spacer relative to the base is formed; and
forming a channel on the protective layer corresponding to the second color resist block, wherein the sub photo spacer is directly connected to the second color resist block, to form the height difference between the main photo spacer and the sub photo spacer.

In the manufacturing method of the display panel of the present invention, wherein each of the first color resist block and the second color resist block comprises at least one layer of color resist.

In the manufacturing method of the display panel of the present invention, wherein each of the first color resist block and the second color resist block comprises two layers of color resists having different colors.

In the display panel of the present invention, wherein each of the first color resist block and the second color resist block comprises one layer of color resist.

In the manufacturing method of the display panel of the present invention, wherein each of the first color resist block and the second color resist block comprise layers of color resists.

In the manufacturing method of the display panel of the present invention, wherein the first color resist block comprises layers of color resists, and the second color resist block comprises one layer of color resist, to increase the height difference between the main photo spacer and the sub photo spacer. In the manufacturing method of the display panel of the present invention, wherein a width of the first color resist block is greater than a width of the second color resist block, such that a thickness of the light-shielding layer disposed on the first color resist layer is greater than a thickness of the light-shielding layer disposed on the second color resist layer, to increase the height difference between the main photo spacer and the sub photo spacer.

In the manufacturing method of the display panel of the present invention, wherein a thickness of the protective layer between the first protrusion and the first color resist block is configured as a default thickness to adjust the height difference between the main photo spacer and the sub photo spacer.

The light-shielding layer of the present invention disposed on the protective layer, and aligned with the channel. The light-shielding layer comprises a base, a first protrusion corresponding to the first color resist block, and a second protrusion corresponding to the second color resist block, the first protrusion is configured as a main photo spacer, the second protrusion is configured as a sub photo spacer, such that a height difference between the main photo spacer and the sub photo spacer relative to the base is formed. The protective layer is formed with a channel is formed on the protective layer corresponding to the second color resist block, the sub photo spacer is directly connected to the color resist block, such that the height difference between the main photo spacer and the sub photo spacer is formed. The height difference between the main photo spacer and the sub photo spacer is achieved via the thickness of the protective layer. The height difference between both the main photo spacer and the sub photo spacer and the base is achieved via the thickness of color resist block. Then, the BPS mask utilizes only one light transmittance, which use a simple mask and low-cost. By using the easier way to accomplish three height differences of BPS, the manufacturing processes and the difficulties of material development are effectively reduced, saving masks costs and manufacturing processes. For a better understanding of the aforementioned content of the present invention, preferable embodiments are illustrated in accordance with the attached figures for detailed explanation.

DESCRIPTION OF THE DRAWINGS

For better explaining the technical solution and the effect of the present invention, the present invention will be further described in detail with the accompanying drawings and the specific embodiments.

DETAILED DESCRIPTION OF THE PREFERRED EMBODIMENTS

For further explaining the technical solutions and the effects of the present invention, the embodiments of the present invention will be further described in combination with the accompanying drawings of the present invention in follows. Obviously, the described embodiments are merely part of the embodiments of the present invention, rather than all the embodiments. Based on the embodiments of the present invention, all other embodiments obtained by an ordinary skill in the art without making inventive efforts fall into the protection scope of the present invention.

Figure 3:
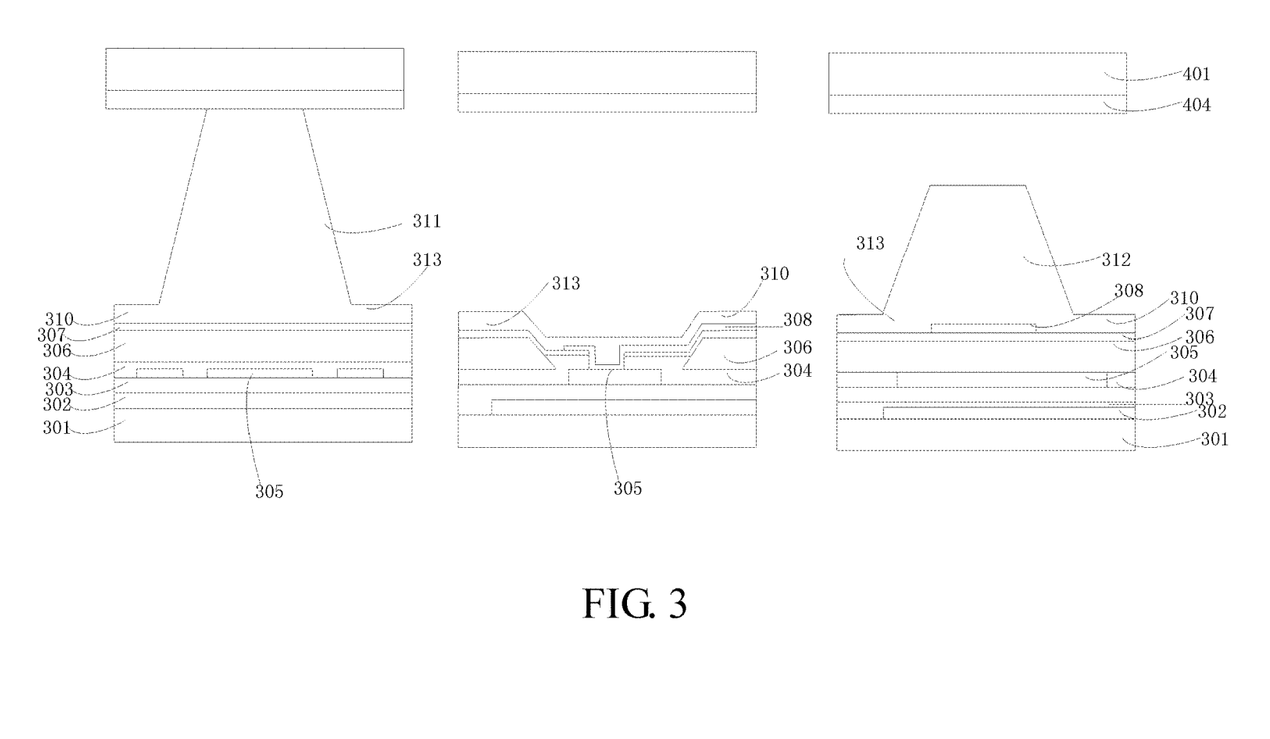
FIG. 3 is a schematic view of a structure of a display panel according to a preferred embodiment of the present invention.
Figure 4:
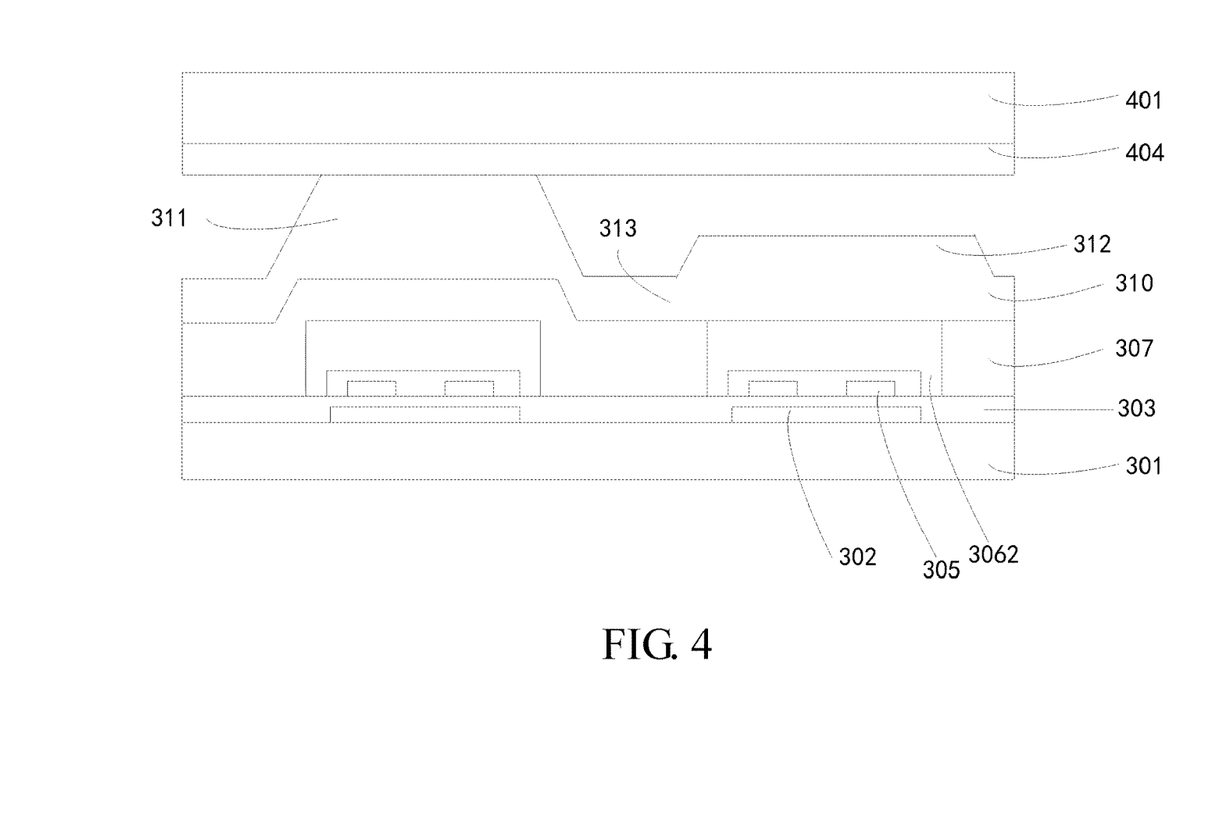
FIG. 4 is another schematic view of structure of a display panel according to a preferred embodiment of the present invention.
Figure 5:
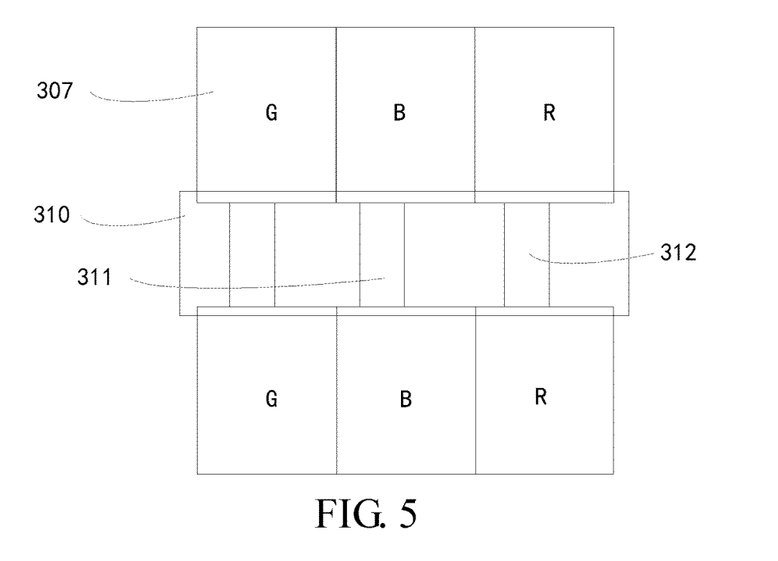
FIG. 5 is a schematic top view of the structure of a display panel according to a preferred embodiment of the present invention.

Referring now to FIGS. 3, 4 and 5, preferred embodiment of the present invention discloses a display panel which comprises a substrate layer 301, a first metal layer 302, a first insulating layer 303, a second metal layer 305, color resist layer 306, a protective layer 307 and a light-shielding layer 310 arranged in sequence;

wherein, the substrate layer 301 can be a low temperature poly-silicon substrate (LTPS), and also can be a glass substrate, a resin substrate, etc. The first metal layer 302 formed on the substrate layer 301, and the first metal layer comprises a gate line; the first insulating layer 303 formed on the first metal layer 302; The second metal layer 305 is formed on the first insulating layer 303, and the second metal layer and the gate line form a thin film transistor. The second metal layer 305 further comprises a data line. A color resist layer 306 formed on the second metal layer 305, and a channel is formed on the color resist layer corresponding to the gate line. The channel has a first color resist block 3061 and a second color resist block 3062 therein, and the first color resist block 3061 and the second color resist block 3062 are spaced apart from each other. A protective layer 307 is formed on the color resist layer 306 and configured to protect the color resist layer 306.

Figure 2:
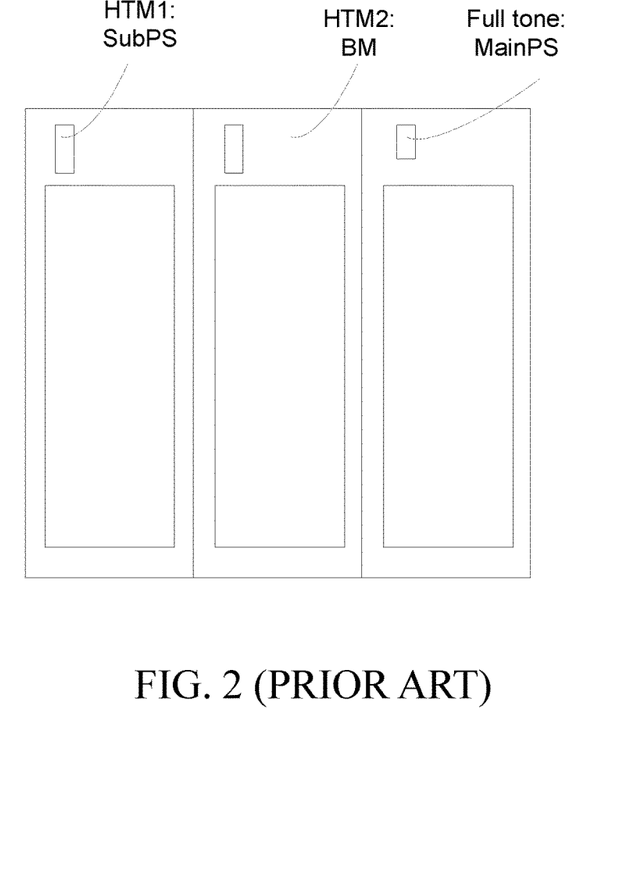
FIG. 2 is a schematic view of a mask of a conventional display panel.

The light-shielding layer 310 formed on the protective layer 307 and is aligned with the channel. The light-shielding layer 310 comprises a base 313, a first protrusion 3061 corresponding to the first color resist block 311, and a second protrusion 3062 corresponding to the second color resist block 312, the first protrusion 311 is configured as a main photo spacer, the second protrusion 312 is configured as a sub photo spacer, and a height difference between the main photo spacer and the sub photo spacer relative to the base 313 is formed;

A channel 307 is formed corresponding to the second color resist block 3062, the sub photo spacer is directly connected to the second color resist block 3062, such that the height difference between the main photo spacer and the sub photo spacer is formed;

Conventional display panel combines the two manufacturing processes of BM and PS using BPS material. Please refer to FIG. 2, and applies three different exposure intensities to BPS to achieve BPS patterns with three different thicknesses.

In an embodiment of the present invention, the height difference between the main photo spacer and the sub photo spacer is achieved via the thickness of the protective layer. The height difference between both the main photo spacer and the sub photo spacer and the base is achieved via the thickness of color resist block. Therefore, the BPS mask utilizes only one light transmittance, which use a simple mask and low-cost. By using the easier way to accomplish three height differences of BPS, manufacturing processes and the difficulties of material development are effectively reduced, saving masks costs and manufacturing processes.

Optionally, the second metal layer 305 can be disposed with a second protective layer 304. A pixel electrode 308 is formed on the protective layer 307, and the pixel electrode is electrically coupled to the second metal layer. The display panel also comprises a color filter substrate, which comprises a second substrate 401 and a pixel electrode 402.

Optionally, the first color resist block 3061 and the second color resist block 3062 comprise one color resist layer, which is easy to produce. The color resist layer is disposed in accordance with the positions of the first color resist block 3061 and the second color resist block 3062. For example, the color resist layer comprises a red color resist area, a green color resist area and a blue color resist area. The first color resist block 3061 comprises a blue color resist layer in the blue color resist area, and the second color resist block 3062 comprises a red color resist layer in the red color resist area.

Figure 6:
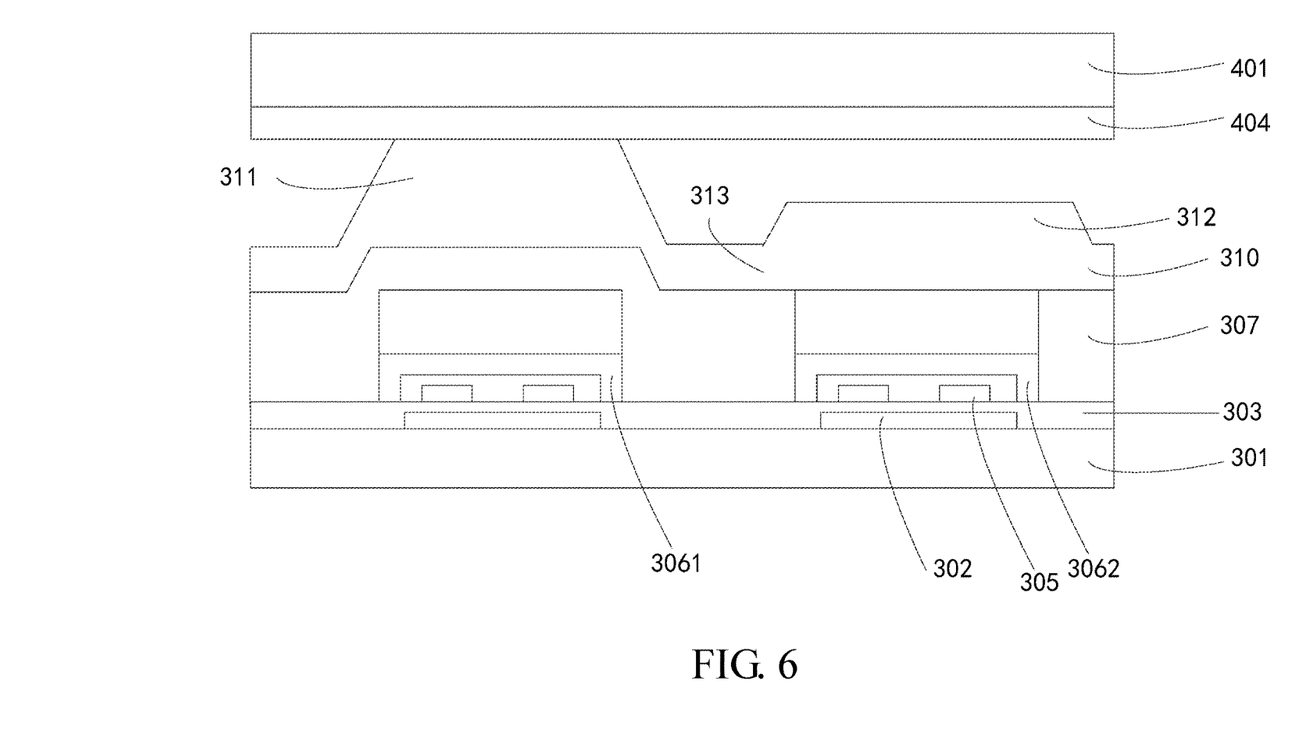
FIG. 6 is another schematic view of structure of a display panel according to a preferred embodiment of the present invention.

Also, optionally, please refer to FIG. 6, where the first color resist block 3061 and the second color resist block 3062 comprises color resists layers, which easily increase the height difference between both the main photo spacer and the sub photo spacer and the base 313 of color resist layer 306. The layers of color resists can be two layers of color resists or more than two layers of color resists such as three layers, four layers, etc. The two layers of color resists can have one color or different colors, for example, a stack of a red resist layer and a blue resist layer. This not only increases the height difference, but also has better light shielding.

Also, optionally, the first color resist block 3061 comprises layers of color resist and the second color resist block comprises a color resist layer, to increase the height difference between the main photo spacer and the sub photo spacer.

Specifically, a channel is formed on the color resist layer 306. The protective layer 307 forms a groove corresponding to the channel, and the groove filled with BPS material to form a light-shielding layer 310. Two layers of color resists or more than two layers of color resists are disposed in the channel corresponding to the main photo spacer. A color resist layer is disposed in the channel corresponding to the sub photo spacer, to form three height differences between the base 313 of the light-shielding layer 310, the sub photo spacer and the main photo spacer. The base 313 of the light-shielding layer 310 formed a new BM. In this way, a mask uses one light transmittance to produce a BM, a main PS, and a sub PS. The main photo spacer stacked up by two layers of color resists or more than two layers of color resists. The sub PS stacked up by one color resist layer. The BM, the main PS, and the sub PS use 100% of light transmittance.

In some embodiments of the present invention, the first color resist block 3061 and the second color resist block 3062 connect to two sides of the channel, respectively, a width of the first color resist block 3061 is greater than a width of the second color resist block 3062, such that a thickness of the light-shielding layer 310 disposed on the first color resist layer 3061 is greater than a thickness of the light-shielding layer 310 disposed on the second color resist layer 3062, and to increase the height difference between the main photo spacer and the sub photo spacer.

Because the thickness of the protective layer and the light-shielding layer become greater as the surface area of the color resist block becomes greater, the thickness of the protective layer and the light-shielding layer disposed on the first color resist block is greater than the thickness of the protective layer and the light-shielding layer disposed on the second color resist block. The length of the first color resist block 3061 is equal to the length of the second color resist 3062. The height difference between the main photo spacer and the sub photo spacer can be achieved via adjusting the width of color resist block. According to the results of experiments, the width of the color resist block is 20 um and 100 um, and the height of the corresponding main PS is 3.2 um and 3.8 um, respectively. Thus, the height difference between the main PS and the sub PS can be achieved to be 0.5 um-0.6 um, fulfilling the design requirement.

Figure 7:
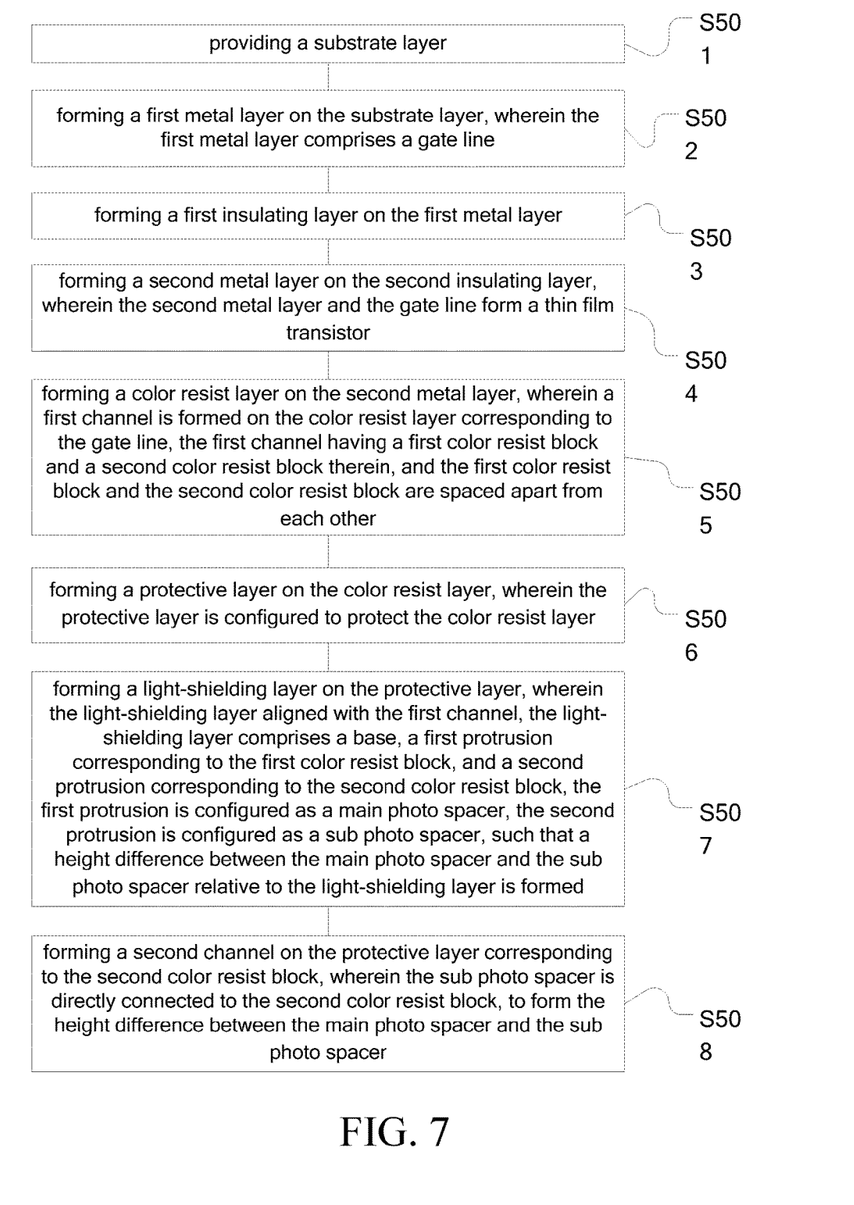
FIG. 7 is a flowchart of a manufacturing method of a display panel according to a preferred embodiment of the present invention.

Referring to FIG. 7, in the embodiment of the present invention further discloses a manufacturing method of a display panel, comprising steps S501-S508.

S501: providing a substrate layer.

S502: forming a first metal layer on the substrate layer, in which the first metal layer comprises a gate line.

S503: forming a first insulating layer on the first metal layer.

S504: forming a second metal layer on the second insulating layer, in which the second metal layer and the gate line form a thin film transistor.

S505: forming a color resist layer on the second metal layer, in which a channel is formed on the color resist layer corresponding to the gate line, and the first color resist block and the second color resist block are spaced apart from each other.

S506: forming a protective layer on the color resist layer, in which the protective layer is configured to protect the color resist layer.

S507: forming a light-shielding layer on the protective layer, in which the light-shielding layer aligned with the channel, the light-shielding layer comprises a base, a first protrusion corresponding to the first color resist block, and a second protrusion corresponding to the second color resist block, the first protrusion is configured as a main photo spacer, the second protrusion is configured as a sub photo spacer, such that a height difference between the main photo spacer and the sub photo spacer relative to the light-shielding layer is formed.

S508: forming a channel on the protective layer corresponding to the second color resist block, in which the sub photo spacer is directly connected to the second color resist block, to form the height difference between the main photo spacer and the sub photo spacer.

In the embodiment of the present invention, the height difference between the main photo spacer and the sub photo spacer is achieved via the thickness of the protective layer. The height difference between both the main photo spacer and the sub photo spacer and the base is achieved via the thickness of color resist block. Therefore, the BPS mask utilizes only one light transmittance, which use a simple mask and low-cost. By using the easier way to accomplish three height differences of BPS, the manufacturing processes and the difficulties of material development are effectively reduced, saving masks costs and manufacturing processes.

Optionally, each of the first color resist block and the second color resist block comprise one color resist layer, which is easy to produce. The color resist layer deposed in accordance with the positions of the first color resist block and the second color resist block, for example, the color resist layer comprises a red color resist area, a green color resist area and a blue color resist area. The first color resist block comprising a blue color resist layer in the blue color resist area, and the second color resist block comprises a red color resist layer in the red color resist area.

Optionally, each of the first color resist block and the second color resist block comprise layers of color resists, which easily increase the height difference between both the main photo spacer and the sub photo spacer and the base of color resist layer. The layers of color resists can be two layers of color resists or more than two layers of color resists such as three layers, four layers, etc. The two layers of color resists can have one color or different colors, for example, a stack of a red resist layer and a blue resist layer. This not only increases the height difference, but also has better light shielding.

Also, optionally, the first color resist block comprises layers of color resist and the second color resist block comprises a color resist layer, to increase the height difference between the main photo spacer and the sub photo spacer. Specifically, a channel formed on the color resist layer. The protective layer forms a groove corresponding to the channel, the groove is filled with BPS material to form a light-shielding layer. Two layers of color resists or more than two layers of color resists disposed in the channel corresponding to the main photo spacer. A color resist layer disposed in the channel corresponding to the sub photo spacer, to form three height differences between the base of the light-shielding layer, the sub photo spacer and the main photo spacer. The base of the light-shielding layer forms a new BM. In this way, a mask uses one light transmittance to produce a BM, a main PS, and a sub PS. The main PS stacked up by two layers of color resists or more than two layers of color resists. The sub PS stacked up by one color resist layer. The BM, the main PS and the sub PS use 100% of light transmittance.

In some embodiment of the present invention, a width of the first color resist block is greater than a width of the second color resist block, such that a thickness of the light-shielding layer disposed on the first color resist layer is greater than a thickness of the light-shielding layer disposed on the second color resist layer, and increase the height difference between the main photo spacer and the sub photo spacer.

Because the thickness of the protective layer and the light-shielding layer become greater as the surface area of the color resist block becomes greater, the thickness of the protective layer and the light-shielding layer disposed on the first color resist block is greater than the thickness of the protective layer and the light-shielding layer disposed on the second color resist block. The length of the first color resist block 3061 is equal to the length of the second color resist 3062. The height difference between the main photo spacer and the sub photo spacer can be achieved via adjusting the width of color resist block. According to the results of experiments, the width of the color resist block is 20 um and 100 um, and the height of the corresponding main PS is 3.2 um and 3.8 um, respectively. Thus, the height difference between the main PS and the sub PS can be achieved to be 0.5 um-0.6 um, fulfilling the design requirement.

In the embodiment of the present invention, a thickness of the protective layer between the first protrusion and the first color resist block is configured as a default thickness to adjust the height difference between the main photo spacer and sub photo spacer. The default thickness is in accordance with the requirement of the height difference between the main photo spacer and the sub photo spacer, to form a thickness of the protective layer disposed between the first protrusion and the first color resist block is formed to adjust the height difference between the main photo spacer and the sub photo spacer.

BPS material has bad stability and uniformity to Half tone (HT). Using full tone mask (FTM, i.e. 100% of light transmittance), the stability of both material and design are increased and the requirement of the capability of material is reduced. Using the design of two layers of color resists, the thickness of the bottom stage increases such that the thickness of BPS coating relatively reduced. On one hand reducing the cost of material, on the other hand reducing the thickness of BPS to increase design feasibility, and also prevent the thickness of BPS to be too thick that cannot be recognized by the mask of BPS manufacturing process. Regulation ability of the two layers of color resists for height difference is also greater. In summary, although the present invention has been described with preferred embodiments thereof, the above preferred embodiments is not used to limit the present invention. One of ordinarily skill in the art can carry out changes and modifications to the described embodiment without departing from the scope and the spirit of the invention that is intended to be limited only by the appended claims.

What is claimed is:
1. A display panel, comprising:
a substrate layer;
a first metal layer formed on the substrate layer, wherein the first metal layer comprises a gate line;
a first insulating layer formed on the first metal layer;
a second metal layer formed on the first insulating layer, wherein the second metal layer and the gate line form a thin film transistor;
a color resist layer formed on the second metal layer, wherein a first channel is formed on the color resist layer corresponding to the gate line, the first channel having a first color resist block and a second color resist block therein, and the first color resist block and the second color resist block are spaced apart from each other;
a protective layer formed on the color resist layer and configured to protect the color resist layer; and
a light-shielding layer formed on the protective layer and aligned with the first channel, wherein the light-shielding layer comprises a base, a first protrusion corresponding to the first color resist block, and a second protrusion corresponding to the second color resist block, the first protrusion is configured as a main photo spacer, the second protrusion is configured as a sub photo spacer, and a height difference between the main photo spacer and the sub photo spacer relative to the base is formed;
wherein a second channel is formed on the protective layer corresponding to the second color resist block, the sub photo spacer is directly connected to the second color resist block, such that the height difference between the main photo spacer and the sub photo spacer is formed;
wherein the first color resist block and the second color resist block are connected to two sides of the second channel, respectively, a width of the first color resist block is greater than a width of the second color resist block, such that a thickness of the light-shielding layer disposed on the first color resist layer is greater than a thickness of the light-shielding layer disposed on the second color resist layer, to increase the height difference between the main photo spacer and the sub photo spacer; and
wherein each of the first color resist block and the second color resist block comprise at least one layer of color resist.
2. The display panel according to claim 1, wherein each of the first color resist block and the second color resist block comprises two layers of color resists having different colors.

3. The display panel according to claim 1, wherein each of the first color resist block and the second color resist block comprises one layer of color resist.

4. The display panel according to claim 1, wherein each of the first color resist block and the second color resist block comprise layers of color resists.

5. The display panel according to claim 1, wherein the first color resist block comprises layers of color resists, and the second color resist block comprises one layer of color resist, to increase the height difference between the main photo spacer and the sub photo spacer.

6. A display panel, comprising,
a substrate layer;
a first metal layer formed on the substrate layer, wherein the first metal layer comprises a gate line;
a first insulating layer formed on the first metal layer;
a second metal layer formed on the first insulating layer, wherein the second metal layer and the gate line form a thin film transistor;
a color resist layer formed on the second metal layer, wherein a first channel is formed on the color resist layer corresponding to the gate line, the first channel having a first color resist block and a second color resist block therein, and the first color resist block and the second color resist block are spaced apart from each other;
a protective layer formed on the color resist layer and configured to protect the color resist layer; and
a light-shielding layer formed on the protective layer and aligned with the first channel, wherein the light-shielding layer comprises a base, a first protrusion corresponding to the first color resist block, and a second protrusion corresponding to the second color resist block, the first protrusion is configured as a main photo spacer, the second protrusion is configured as a sub photo spacer, and a height difference between the main photo spacer and the sub photo spacer relative to the base is formed; and
wherein a second channel corresponding to the second color resist block, the sub photo spacer is directly connected to the second color resist block, such that the height difference between the main photo spacer and the sub photo spacer is formed.

7. The display panel according to claim 6, wherein each of the first color resist block and the second color resist block comprises two layers of color resists.

8. The display panel according to claim 6, wherein each of the first color resist block and the second color resist block comprises two layers of color resists having different colors.

9. The display panel according to claim 6, wherein each of the first color resist block and the second color resist block comprises one layer of color resist.

10. The display panel according to claim 6, wherein each of the first color resist block and the second color resist block comprise layers of color resists.

11. The display panel according to claim 6, wherein the first color resist block comprises layers of color resists, and the second color resist block comprises one layer of color resist, to increase the height difference between the main photo spacer and the sub photo spacer.

12. The display panel according to claim 6, wherein the first color resist block and the second color resist block are connected to two sides of the second channel, respectively, a width of the first color resist block is greater than a width of the second color resist block, such that a thickness of the light-shielding layer disposed on the first color resist layer is greater than a thickness of the light-shielding layer disposed on the second color resist layer, to increase the height difference between the main photo spacer and the sub photo spacer.

13. A method for manufacturing a display panel, comprising steps of:
providing a substrate layer;
forming a first metal layer on the substrate layer, wherein the first metal layer comprises a gate line;
forming a first insulating layer on the first metal layer;
forming a second metal layer on the second insulating layer, wherein the second metal layer and the gate line form a thin film transistor;
forming a color resist layer on the second metal layer, wherein a first channel is formed on the color resist layer corresponding to the gate line, the first channel having a first color resist block and a second color resist block therein, and the first color resist block and the second color resist block are spaced apart from each other;
forming a protective layer on the color resist layer, wherein the protective layer is configured to protect the color resist layer;
forming a light-shielding layer on the protective layer, wherein the light-shielding layer aligned with the first channel, the light-shielding layer comprises a base, a first protrusion corresponding to the first color resist block, and a second protrusion corresponding to the second color resist block, the first protrusion is configured as a main photo spacer, the second protrusion is configured as a sub photo spacer, such that a height difference between the main photo spacer and the sub photo spacer relative to the base is formed; and
forming a second channel on the protective layer corresponding to the second color resist block, wherein the sub photo spacer is directly connected to the second color resist block, to form the height difference between the main photo spacer and the sub photo spacer.

14. The method for manufacturing the display panel according to claim 13, wherein each of the first color resist block and the second color resist block comprises at least one layer of color resist.

15. The method for manufacturing the display panel according to claim 13, wherein each of the first color resist block and the second color resist block comprises two layers of color resists having different colors.

16. The method for manufacturing the display panel according to claim 13, wherein each of the first color resist block and the second color resist block comprises one layer of color resist.

17. The method for manufacturing the display panel according to claim 13, wherein each of the first color resist block and the second color resist block comprise layers of color resists.

18. The method for manufacturing the display panel according to claim 13, wherein the first color resist block comprises layers of color resists, and the second color resist block comprises one layer of color resist, to increase the height difference between the main photo spacer and the sub photo spacer.

19. The method for manufacturing the display panel according to claim 13, wherein a width of the first color resist block is greater than a width of the second color resist block, such that a thickness of the light-shielding layer disposed on the first color resist layer is greater than a thickness of the light-shielding layer disposed on the second color resist layer, to increase the height difference between the main photo spacer and the sub photo spacer.

20. The method for manufacturing the display panel according to claim 13, wherein a thickness of the protective layer between the first protrusion and the first color resist block is configured as a default thickness to adjust the height difference between the main photo spacer and the sub photo spacer.

* * * * *